(12) United States Patent
Buchhold et al.

(10) Patent No.: US 8,213,133 B2
(45) Date of Patent: Jul. 3, 2012

(54) LOAD BREAKER ARRANGEMENT

(75) Inventors: Stefan Buchhold, Lohfelden (DE); Sven Bremicker, Alheim-Baumbach (DE); Frank Greizer, Kaufungen (DE); Günther Cramer, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 716 days.

(21) Appl. No.: 12/286,429

(22) Filed: Sep. 30, 2008

(65) Prior Publication Data

US 2009/0097172 A1 Apr. 16, 2009

(30) Foreign Application Priority Data

Oct. 12, 2007 (EP) .................................... 07019985

(51) Int. Cl.
*H02H 3/00* (2006.01)
*H02H 7/00* (2006.01)
(52) U.S. Cl. ..................... 361/8; 218/2; 218/3
(58) Field of Classification Search ................. 361/2–14; 218/2, 3
See application file for complete search history.

(56) References Cited

U.S. PATENT DOCUMENTS

| | | | |
|---|---|---|---|
| 5,633,540 A | 5/1997 | Moan | |
| 6,741,435 B1 | 5/2004 | Cleveland | |
| 6,768,621 B2 * | 7/2004 | Amundsen et al. | 361/93.1 |
| 7,110,225 B1 * | 9/2006 | Hick | 361/8 |
| 7,586,770 B2 * | 9/2009 | Toba et al. | 363/97 |
| 2002/0171983 A1 | 11/2002 | Brooks, Jr. | |
| 2004/0027734 A1 * | 2/2004 | Fairfax et al. | 361/2 |
| 2006/0077599 A1 * | 4/2006 | Laschinksi et al. | 361/2 |

FOREIGN PATENT DOCUMENTS

| | | |
|---|---|---|
| DE | 10225259 | 1/2004 |
| DE | 102004054933 | 5/2006 |
| GB | 2049326 | 12/1980 |
| JP | 2005019107 | 1/2005 |
| WO | 2007/073951 | 7/2007 |

* cited by examiner

*Primary Examiner* — Rexford Barnie
*Assistant Examiner* — Christopher Clark
(74) *Attorney, Agent, or Firm* — Eschweiler & Associates, LLC

(57) ABSTRACT

A load breaker arrangement includes first and second input terminals, respectively, and first and second output terminals. The arrangement also includes two relays connected in series with one another, wherein the two relays are coupled between the second input terminal and the second output terminal, a semiconductor switch connected in parallel with one of the two relays, and a third relay coupled between the first input terminal and the first output terminal. A control circuit, in a load breaker mode, turns on the semiconductor switch while the two relays and the third relay are closed, then opens the one of the two relays in parallel with the semiconductor switch, then opens the semiconductor switch to break a current between the second input and second output terminals, and then opens the other of the two relays not in parallel with the semiconductor switch and opens the third relay.

7 Claims, 3 Drawing Sheets

LOAD BREAKER ARRANGEMENT

CROSS-REFERENCE TO RELATED APPLICATIONS

This application claims Priority from European Application No. EP 07019985.6 filed on Oct. 12, 2007

BACKGROUND OF THE INVENTION

1. Field of the Invention

The invention relates to a load breaker arrangement for switching a DC current of a DC current circuit on and off in a photovoltaic plant with a semiconductor switching element for preventing a switching arc, there being provided an electronic control unit configured such that one or more signals are received by the control unit and the load breaker arrangement being configured such that in at least one current-carrying line of the DC current circuit there is a galvanic separation by a switching contact that is automatically controllable by the control unit in the switched-off condition and that one or more control signals at the load breaker arrangement are passed to the load breaker arrangement and a semiconductor switch element interrupting the DC current for the switching contact to be de-energized.

Load breaker arrangements for switching a DC current of a DC current circuit on and off in a photovoltaic plant need a suited switching means. The DC current generated by solar energy in photovoltaic modules or in the solar generator, which is converted by an inverter for example into an alternating voltage suitable for a utility grid, can be passed to the inverter or interrupted by the load breaker arrangement.

2. Description of the Prior Art

DC relays are known, which are capable of interrupting a current through switching contacts. The relay incorporates a control coil through which an electric current flows for a metal armature to attract. This metal armature is mechanically connected to one or several electrical main contacts. The main contacts are switched on or off by an attraction movement of the armature toward the control coil depending on whether the relay is configured to be an opening or a closing relay. In principle, such a relay is an electrically controllable switch.

However, relays have the disadvantage that switching arcs occur, in particular when switching off the DC current. This temporarily leads to high temperatures and to a high contact burn of the switching contacts. As a result, the switching contacts can easily fuse together so that they virtually adhere together and are no longer capable of ensuring current interruption. This phenomenon is known under the term of "contact fusing". Relays are often utilized for lower currents normally not exceeding 30 A.

Comparable electrically controllable switches are termed gates. As compared to relays, they are of a more robust implementation and devised for higher currents such as for up to several 100 A, the risk of contact fusing being reduced. This risk however cannot be completely avoided. The gates however have the disadvantage that they are quite big and also expensive. Moreover, they need a high hold power for the control coil. However, one aims at utilizing the generated energy as effectively as possible not only in photovoltaic plants.

Relay and gate have however the advantage that they can be optionally equipped with additional auxiliary switches connected in series that can be utilized for control purposes. An auxiliary circuit may for example be provided for triggering, through the auxiliary switch, a signal lamp signalizing a failure such as a short circuit.

Other known switching apparatus are load switches or automatic circuit breakers. Such apparatus are fuses or automatically enabling switches that switch off at high current. These apparatus often have an overcurrent and a short circuit function. The overcurrent function is mostly realized by a wire wound about a bi-metal spring and deforming the spring at high current for an enabling mechanism connected to switching contacts to be actuated. This overcurrent protection function is slow. In case of a short circuit or at very high current, very fast electromagnetic forces act very fast upon the enabling mechanism and/or upon the switching contacts themselves so as to allow for fast separation of the switching contacts. In order to reduce occurring switching arcs, quenching plates are utilized as they are also partially used in gates. Accordingly, the risk of contact fusing is quite low. A control of the switching contacts however is only possible with special remote control modules that are very expensive and are only sold for apparatus operating at high current or at high switching powers. If cut off is to occur because of another event such as because a housing cover is opened, solutions with such apparatus are only to be realized for high currents and only at high cost and with considerable space occupancy.

On photovoltaic plants, short circuit currents are normally 20 to 40% higher than in nominal operation because of the characteristic curve typical for solar cells. In such type protection devices however, the current needs to be 50% to 100% higher in order for the short-circuit protection to respond. As a result, a DC current will not be cut off or only late in the event of a short circuit. For safety reasons, this is not acceptable though.

Moreover, the switch-off current is always higher than the nominal current, the fuse cutting off the faster the higher the overcurrent. In case of only low currents, the protection may overheat. Accordingly, such a protection is only conditionally suited for use to protect photovoltaic plants.

Simple fuses are also known. Such a fuse consists of a fuse wire or of a microstrip conductor that is guided and electrically connected with contact elements at the ends of the fuse. The housing can be filled with air, a gas or other fill materials. If the current flowing through the fuse is higher than the nominal current of the fuse, the wire or inserted conductor melts so that the current circuit is interrupted.

Such type fuses are low in cost and very well suited for protecting apparatus and electric components such as circuits or lines and even for very high currents such as several 100 A, and voltages such as several 100 V. A fuse however cannot be reused once it has been enabled and must be replaced. Only an overcurrent comes into consideration as the enabling event. A current interruption due to another event is not possible.

Mechanical DC switches are also known. They comprise a manually operable control element. From outside, this control element is accessible so that it can be brought into one or several other positions through a movement such as a movement of rotation, a pulling or a pushing movement. The manual movement actuates a contact mechanism which in turn actuates an electrical main contact. Such a switch is a manually operable switch with several contact positions that can be achieved by various detent positions of the operating part. They can switch several contacts concurrently in order for example to separate several current circuits at the same time. They are also suited for high switching currents and voltages such as several 100 A and several 100 V. However, they have the disadvantage of requiring much space and of high wiring expense. Moreover, they can only be operated by hand so that they cannot be used for protecting functions such as overcurrent and also not for automatic enablement in other events.

Other current breaker systems suited for photovoltaic plants are known under the term of "Electronic Solar Switch (ESS)" or are described in closer detail in DE 102 25 259 B3 or in DE 10 2004 054 933 B3.

The ESS is disposed in one of the two DC lines. If a mechanical switch is operated, a parallel connected semiconductor switch switches on or off. As a result, arcing is prevented or reduced. Accordingly, the ESS is in principle a manually actuatable switch with electronic assistance for blowing the electric arc out. It is tuned to a photovoltaic inverter and suited for a current of up to more than 10 A and for a voltage of up to more than 100 V. Such an ESS is operable manually only.

The document DE 102 25 259 B3 describes a plug connector connecting a photovoltaic generator to an inverter. Galvanic separation occurs by manually unplugging the plug connector.

In the document DE 10 2004 054 933 B3 there is described a protective cover with electrical contacts and with a handle. By removing the protective cover from an inverter and by subsequently removing the DC plug, a photovoltaic generator is galvanically separated from the inverter.

From the WO 2007/073951 A, a load breaker arrangement for switching off and on a DC current of a DC current circuit in a photovoltaic plant with a semiconductor switch element is known to avoid a switching arc. An electronic control unit is provided for this purpose. In the current carrying lines of the DC current circuit, a galvanic separation occurs through a relay in the switched off condition, namely through two switching contacts that are automatically controllable by control unit. Further, the semiconductor switching element interrupts the DC current so that the switching contacts are cut off. This document describes a switch with a main switching contact and with an auxiliary contact that is connected to the control. According to this solution, a first current path with the main contact and a second current path with a series connection consisting of a semiconductor switch 2 and the relay contact lying on the negative pole side are provided. The second contact, which is mechanically coupled to the relay, lies on the positive pole side.

Another solution with two relays has been described in U.S. Pat. No. 5,633,540. Here, there are provided two relays and one semiconductor switch. A switching contact of the first relay lies in series with the switching element. The switching contact of the other relay lies in parallel with the series connection.

BRIEF SUMMARY OF THE INVENTION

It is the object of the invention to find a low cost solution by means of which on the one side a DC current in a photovoltaic plant can be securely switched off, not only manually but also automatically in the event of a failure, and by means of which, on the other side, galvanic separation in at least one of the two current carrying lines of the DC current circuit is obtained.

This object is achieved, in accordance with the invention, by the fact that the signals are flaw signals that are received in case of a flaw in the PV generator, inverter or on the AC side, the DC current circuit being automatically switched on or off by the control signals in case of at least one flaw, the arrangement being configured such that, during switch off, the semiconductor switching element is at first closed in a first step, the switching contacts of a first switching means being opened in a second step for the DC current to flow through the semiconductor switching element, the semiconductor switching element being again opened in a third step and switching contacts of a second switching means being opened in order to cause galvanic separation to occur and that an additional manually operable load breaker is connected, said manually operable load breaker being a manually breakable DC current connecting system with plug contacts for photovoltaic plants that is provided with an electronic arc quenching system.

The invention relies on the idea of utilizing at least one, more specifically at least two, electrically controllable switches with switching contacts.

Thanks to the invention, relays can be utilized on the one side, said relays being automatically controlled by the control signals of the control unit of the invention without the risk of contact fusing. In accordance with the invention, the current is separated by the semiconductor switching element so that no switching arc can occur in the relay. In accordance with the invention, the current is broken by the semiconductor switching element so that no switching arc is allowed to occur in the relay. Additionally, a relay utilized for galvanic separation is in particular only de-energized. The advantage thereof is that, in nominal operation, a considerably higher current is allowed to flow through the relay. Therefore the relay must not be oversized. The relays are moreover small, low-cost and need little hold power if compared to gates. In principle, a gate may however also be utilized. The semiconductor switching element can also be periodically switched off and on so that, when switched off, the current flowing in the switching contact is lower so that no arcing occurs. Through clocking a stable electric arc is prevented from occurring in particular in the direct voltage grid.

Also, the load breaker arrangement can be utilized in a simple manner by switching them additionally on or off in case of events other than a short circuit because the relays can be triggered readily. The invention combines the advantages of ESS solutions and of an automated switch-off. As a result, no arc or only a reduced, harmless electric arc occurs during switching so that persons or the plant are not at risk, and a signal can be transferred to the control unit of the load breaker arrangement in case of a flaw.

The invention further relies on the idea to change an ESS operating concept (DE 102 25 259 B3 or DE 10 2004 054 933 B3) in such a manner that the load current will no longer be interrupted by a mechanical plug connector and the electronics act as an electric arc quencher, but that, upon actuation of a handle for example, a signal is merely given to the control unit, said control unit then controlling the switch off operation. The actuation of a handle can be an event in the sense of the invention. But also flaws such as a short circuit can be considered an event.

To carry out the invention, at least one relay, in particular two relays or more, are appropriate.

Using two relays galvanic separation can be maintained even if one of the contacts fuses.

The control unit may additionally implement enabling conditions in case of overcurrent or short circuit currents that are specially adapted to photovoltaic plants. A microprocessor may for example be utilized in the control unit. Preferably, the control unit is integrated in the load breaker arrangement.

In accordance with the invention, there is connected an additional manually operable load breaker, or an ESS load breaker. By removing a plug connector or a protective cover with electric arc protection function, the DC current circuit can be opened manually independent of control signals of the control unit.

A preferred embodiment of the invention is characterized in that, in the current-carrying line of the DC current circuit, two switching means with switching contacts, in particular two relays, which are switchable one after the other through control signals, are arranged in such a manner that one of the switching means is bridged by the semiconductor switching element on the one side so that the DC current is switched off by opening the semiconductor switching element, and that, on the other side, galvanic separation of the DC current circuit occurs through the other switching means. Galvanic separation is cancelled out by contact fusing. Whilst the first relay is bridged by the semiconductor switching element, said relay can open almost without any current because the current passes into the switched on semiconductor switch when the contact is being opened. This does at first not cause an electric arc to form. Since no electric arc can occur in the semiconductor switch, the current can be reduced to zero without risk. The second relay provided for galvanic separation can then be de-energized.

In order to ensure the safest possible current supply of the arrangement components, i.e., relays, control unit and so on, a voltage supply of the load breaker arrangement occurs with advantage both on a DC side and on an AC side so that there is also redundancy.

Further advantageous implementations of the invention will become apparent from the dependent claims.

The invention will be explained in closer detail by way of example with reference to the drawings.

DETAILED DESCRIPTION OF THE INVENTION

Figure 1:
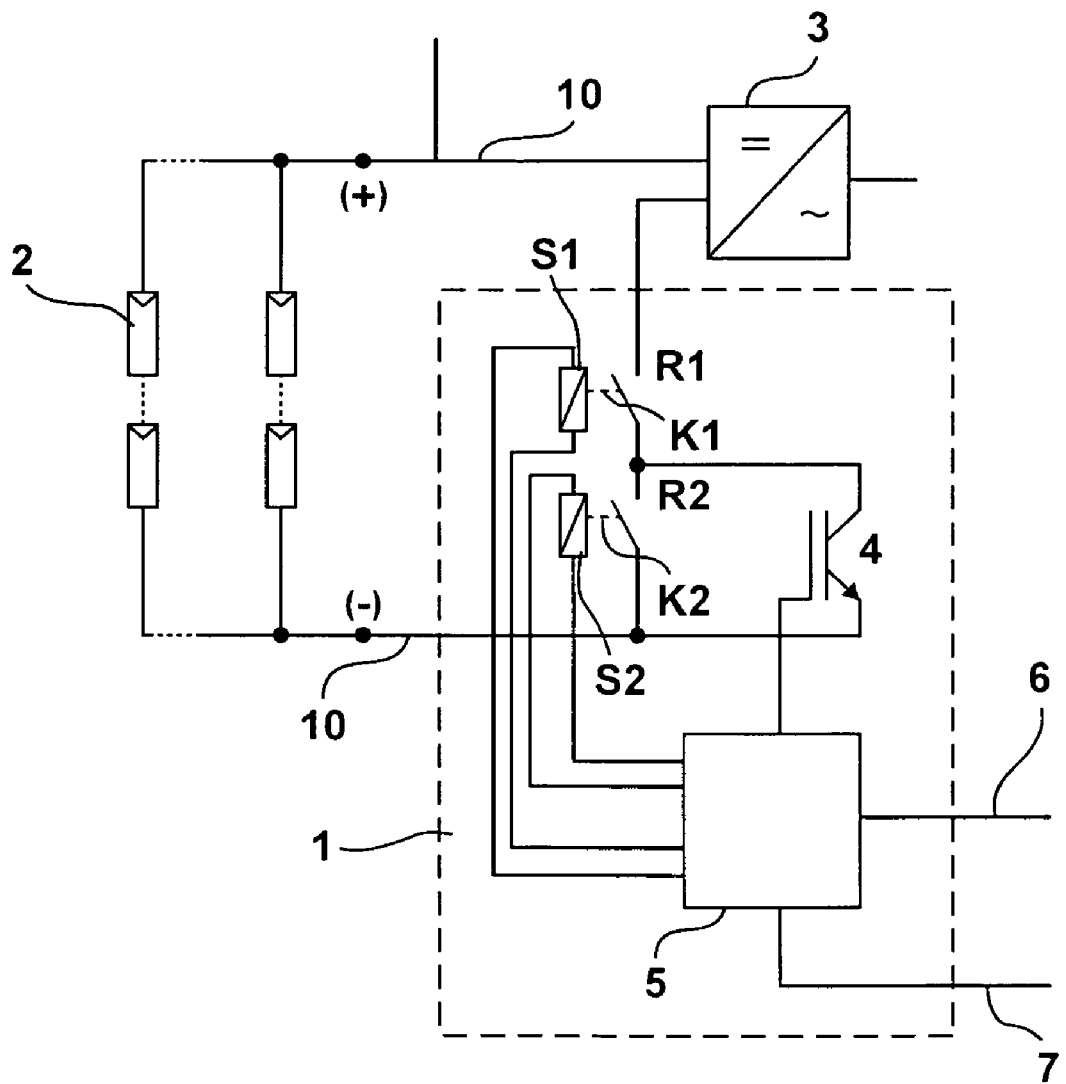
FIG. 1 shows a first circuit of a load breaker arrangement.

FIG. 1 illustrates a first example of a load breaker arrangement 1. This arrangement incorporates two relays R1 and R2. Each relay comprises a control coil S1, S2 with a switching contact K1, K2 or a pair of contacts. Both relays or more precisely both switching contacts K1, K2 are connected in series. For simplicity' sake, they will be referred to as relays.

A semiconductor switching element 4, in particular an IGBT switch, is connected in parallel to the relay.

The arrangement 1 lies in a DC current circuit with DC lines 10 between a photovoltaic generator 2, a photovoltaic plant and an inverter 3 or a DC/AC converter. If the photovoltaic generator 2 is added to the circuit of the inverter 3, the two relays R1, R2 are closed. Both relays are designed for being capable of carrying the needed load current in the closed condition.

Further, the arrangement 1 incorporates an electronic control unit 5 that is connected to the relays R1, R2 or to its control coils S1, S2 thus being capable of automatically actuating the switching contacts K1, K2 through control signals. Additionally, the semiconductor switching element is also controllable by the unit 5.

If the connection between the photovoltaic generator 2 and the inverter 3 is to be separated, the semiconductor switching element 4 is closed first. In a second step, the relay R2 is opened for the load current to flow through the series connection from the relay R1 and from the semiconductor switching element 4. In a third step, the switching element 4 is opened for the full load current to be switched off without arcing. Arcing is thus prevented. In a fourth step, the relay R1 is opened. As a result, galvanic separation between generator 2 and inverter 3 is realized. Since the relay R1 opens without current, no arc can form at its contact K1. The DC current is added to the circuit in reverse order.

These steps are controlled by the control unit 5, i.e., that the relays R1, R2 and the switching element 4 are triggered through a control electronics of the control unit 5. Through a control line 6, an event signal for switching on or off can be delivered. Enabling events may be an overcurrent, an overvoltage, too high a temperature, fire in an apparatus, a flaw in an apparatus, a manual switch-off command, an external electrical command, the opening of a cover of an apparatus, a failure of a public low-voltage utility grid and/or theft of the photovoltaic plant. Such events can be detected through separate electronics or sensors.

An evaluation whether there is an event or a failure can occur either from the control unit 5 or through an external electronic unit, in particular by a unit or electronics in the inverter 3. The control line 6 is used in both variants. Alternatively, several control lines can be utilized for various event signals to be transmitted in parallel. It is also possible to implement the line 6 as a digital communication line or bus, such as RS232 or CAN. Also, the arrangement 1 can transmit a message to an additional external electronic unit through the line 6 or another control and communication line in order to signalize for example that switch-off occurred automatically as a result of an event. A detected cause for a flaw can also be transmitted through this is line.

Further, the control unit 5 is provided with a voltage supply line 7 that is preferably connected redundantly, a supply connection occurring both on the DC side or photovoltaic side and on the AC side or grid side.

The relay R1 or preferably both relays R1, R2 are designed to respectively hold maximum idle voltage of the DC current circuit in the opened condition. Since the relays R1, R2 do not switch off the current, relays with a reduced hold power can be utilized. It the load current were switched off directly, much larger and much more robust relays having a high hold power would be required.

Figure 2:
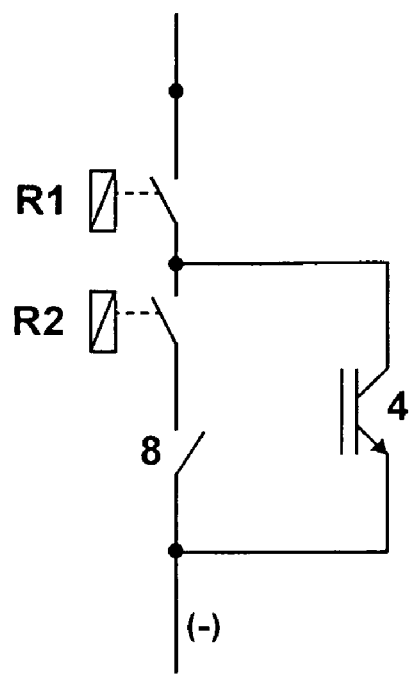
FIG. 2 shows a second circuit of the load breaker arrangement of the invention.

A circuit of the invention is shown in FIG. 2, which only shows the circuit arrangement. This variant is characterized in that an additional, hand operable load breaker 8, in particular an ESS load breaker, is connected in series with relay R2. The load breaker 8 may however also be another switch, mechanical contact or plug connector. Through this variant, both a completely automated switch-off operation can be enabled and a fully manual switch-off operation can be carried out. In case of manual operation, a voltage may be supplied to the ESS from the energy stored in the DC circuit which would occur in case an electric arc would be generated. Additionally or alternatively, voltage may be supplied to the ESS from the energy generated when separating the relay R2, which would cause arcing to occur. As a result, separation is ensured even in case several components come to fail, with arcing being avoided.

It can also be envisaged to exclude the relay R1 shown in FIG. 2. As a result, an ESS concept is widened for demands for a greater number of switching cycles to be met without changing the mechanical operating concept.

ESS is understood to refer to a manually breakable DC current connecting system with plug contacts for photovoltaic plants that is provided with an electronic arc quenching system.

Figure 3:
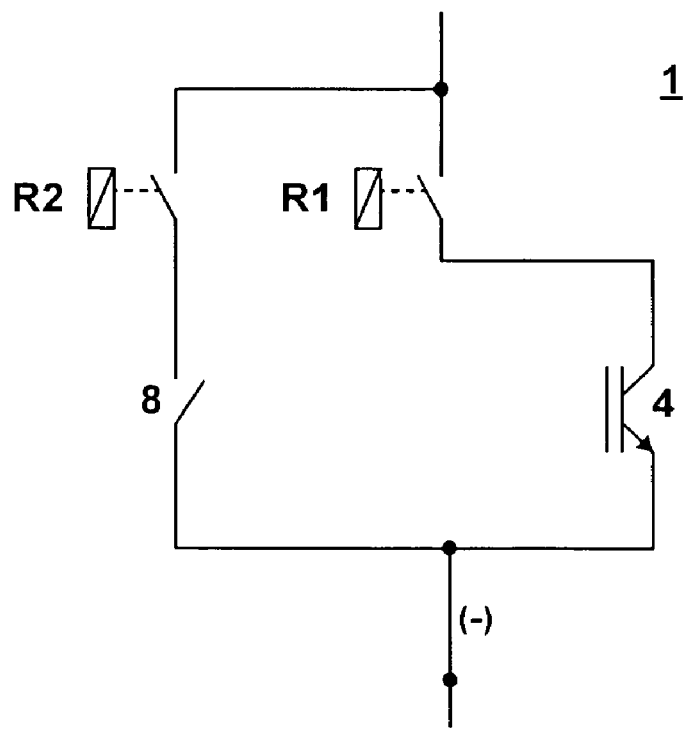
FIG. 3 shows a third circuit of the load breaker arrangement of the invention.

Another variant of the circuit arrangement of the invention is viewed in FIG. 3 in which only the switches are shown. It differs from the one in FIG. 2 by the fact that the load breaker 8 is in series with relay R2 and that the semiconductor switching element 4 is mounted in series with the relay R1. Both relays R1 and R2 are connected in parallel.

Figure 4:
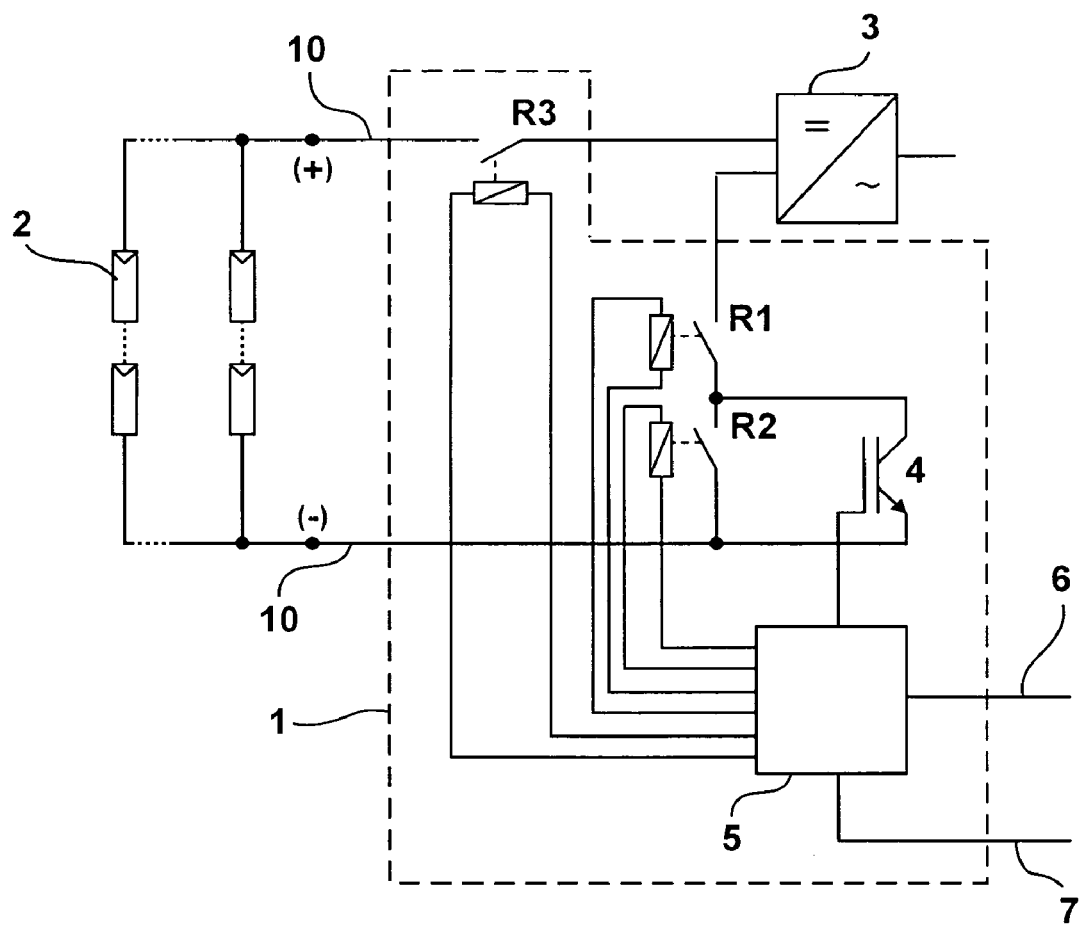
FIG. 4 shows a fourth circuit of a load breaker arrangement.

Another variant is illustrated in FIG. 4. It is comparable with the one in FIG. 1. However, a third relay R3 is additionally connected in the DC(+) line for the two lines 10 or DC(+) and DC(−) to be respectively separated by at least one relay. As a result, galvanic separation is achieved on either pole. The relay R3 is preferably designed for also being capable of carrying the full load current. Since the circuit does not provide for switching off the full load current through the third relay R3, said third relay can also be a small relay with only a low hold power.

LIST OF NUMERALS 1 load breaker arrangement
2 photovoltaic generator
3 inverter
4 semiconductor switching element
5 electronic control unit
6 control line
7 voltage supply line
8 hand operable load breaker
9 –
10 DC-lines
R1, R2, R3 relays
S1, S2 control coils
K1, K2 switching contacts

We claim:

1. A load breaker arrangement, comprising:
    first and second input terminals configured to interface with a DC energy source at positive and negative poles thereof, respectively;
    first and second output terminals configured to interface with a DC side of an inverter circuit at positive and negative poles thereof, respectively;
    two relays connected in series with one another, wherein the two relays are coupled between the second input terminal and the second output terminal;
    a semiconductor switch connected in parallel with one of the two relays;
    a third relay coupled between the first input terminal and the first output terminal; and
    a control circuit configured to, in a load breaker mode, turn on the semiconductor switch while the two relays and the third relay are closed, then open the one of the two relays in parallel with the semiconductor switch, then open the semiconductor switch to break a current between the second input terminal and the second output terminal, and then open the other of the two relays not in parallel with the semiconductor switch and open the third relay.

2. The load breaker arrangement of claim 1, wherein the control circuit is configured to open the third relay after the opening of the other of the two relays.

3. The load breaker arrangement of claim 1, further comprising a manually operable load breaker component in series with the two relays.

4. The load breaker arrangement of claim 3, wherein a series combination of the manually operable load breaker component and the one of the two relays is in parallel with the semiconductor switch.

5. The load breaker arrangement of claim 1, wherein the control circuit is configured to enter the load breaker mode in response to a flaw indication at an input thereof.

6. The load breaker arrangement of claim 1, wherein the control circuit operates alternately in one of a normal operating mode and the load breaker mode, wherein in the normal operating mode the control circuit is configured to close the two relays, close the third relay, and open the semiconductor switch.

7. The load breaker arrangement of claim 1, wherein the opening of the other of the two relays and the third relay is performed concurrently.

* * * * *